United States Patent [19]

van der Heijden

[11] Patent Number: 5,362,370

[45] Date of Patent: Nov. 8, 1994

[54] METHOD FOR THE ELECTROLYTIC REMOVAL OF PLASTIC MOLD FLASH OR BLEED FROM THE METAL SURFACES OF SEMICONDUCTOR DEVICES OR SIMILAR ELECTRONIC COMPONENTS

[75] Inventor: Henricus J. van der Heijden, Haarsteeg, Netherlands

[73] Assignee: Meco Equipment Engineers B.V., EE's-Hertogenbosch, Netherlands

[21] Appl. No.: 64,665

[22] Filed: May 21, 1993

[30] Foreign Application Priority Data

May 21, 1992 [NL] Netherlands ............... 9200898

[51] Int. Cl.⁵ ............................................. C25F 1/00
[52] U.S. Cl. .............................. 204/141.5; 204/129.95
[58] Field of Search ................ 204/141.5, 129.95

[56] References Cited

U.S. PATENT DOCUMENTS

| | | | |
|---|---|---|---|
| 4,781,804 | 11/1988 | Wolf | 204/141.5 |
| 4,828,661 | 5/1989 | Celi | 204/141.5 X |
| 4,968,397 | 11/1990 | Asher et al. | 204/141.5 |
| 5,174,870 | 12/1992 | Puma | 204/141.5 |
| 5,232,563 | 8/1993 | Warfield | 204/141.5 |

Primary Examiner—Donald R. Valentine
Attorney, Agent, or Firm—Oblon, Spivak, McClelland, Maier & Neustadt

[57] ABSTRACT

Immersing semiconductor devices and similar electronic components in an aqueous solution of one or more organic solvents, conducting salts and a wetting agent and connecting the components to be cleaned to the negative pole of a source of direct current, of which the positive pole is connected to an anode in the same solution, and passing current through the solution raises the pH of the electrolyte film on the cathodic metal surface to a value whereby the organic solvent causes a softening of the plastic mold flash or bleed, sufficient to enable the hydrogen gas generated simultaneously on the cathode to remove the plastic mold flash or bleed from the metal surfaces.

13 Claims, 1 Drawing Sheet

METHOD FOR THE ELECTROLYTIC REMOVAL OF PLASTIC MOLD FLASH OR BLEED FROM THE METAL SURFACES OF SEMICONDUCTOR DEVICES OR SIMILAR ELECTRONIC COMPONENTS

BACKGROUND OF THE INVENTION

1. Field of the Invention

The present invention relates to a method for the electrolytic removal of plastic flash or bleed formed on metal surfaces during plastic molding of semiconductor devices and the like by immersing such components in an aqueous (water-based) solution of one or more organic solvents, conducting salts, and a wetting agent and whereby the components to be cleaned are connected to the negative pole of a source of direct current of which the positive pole is connected to an anode in the same solution. The invention also relates to bath compositions to be used for immersing the components.

2. Discussion of the Background

In the manufacturing process of the majority of semiconductors, integrated circuits, transistors and the like for briefness's sake further called semiconductor components, the following production steps can be distinguished. A carrier, called a leadframe is stamped or etched from a copper alloy; nickel-iron alloy or an other metal. A leadframe comprises generally a pad and a number of leads.

The central part of the leadframe, consisting of pad and leadtips, is subsequently selectively electroplated with metals such as gold, silver, palladium, copper or nickel. In the next step a chip is bonded to the leadframe pad and electric wire connections are made between chip and leadtips (wirebonding), followed by encapsulating the central area containing the chip and wirebonded leadtips by injection molding with a plastic, usually an epoxy-based plastic. The manufacturing process is further explained by FIG. 1 in which an integrated circuit (IC) is shown manufactured as described above and of which the outer leads are contaminated with plastic bleed.

In FIG. 1, the plastic encapsulation, which contains the bonded chip and the wirebonded leadtips is indicated by numeral 1, the outer leads by 2. Numeral 3 indicates spaces which usually fill up with plastic during molding of encapsulation 1, while numeral 4 indicates places where very thin films of plastic (normally called "bleed") can contaminate the metal surface of the outer leads and which must be removed. Numeral 5 indicates parts of the leadframe serving interconnection during manufacturing and which will be removed before the IC is used.

The method of the present invention is designed to remove the plastic bleed as indicated in FIG. 1 by numeral 4. Such plastic bleed films on the metal surface of the leads are thin, usually less than 10 micrometers thick, but must be carefully removed to avoid uncoated areas during subsequent tin-lead plating; necessary to enable reliable solder connections to be made to other parts of an electronic circuit.

The traditional way to remove the plastic bleed films from the molded components is to submit the components to abrasive blasting with ground cherry or apricot stones, fine, relatively hard plastic grains or glass beads and the like. Sometimes the blasting operation is preceded by softening of the plastic bleed in organic solvents or by extended treatment in diluted warm acids. A disadvantage of blasting with fine particles is that some of these particles will be embedded in the metal surface of the leads and must be carefully removed before plating with a solderable coating and that the blasting operation will create roughness of the metal surface.

U.S. Pat. No. 4,968,397 describes an electrolytic anodic process with which embedded blasting particles can be removed, while simultaneously metal bleed, such as silver, extending on the leads outside the plastic encapsulation is dissolved, resulting in a clean surface of the leads. To accomplish this effect a solution of lactic acid and a metal hydroxide is used, in which the components are connected to the positive pole of a source of direct current and whereby simultaneously an improved surface condition of copper based metal leads is obtained.

U.S. Pat. No. 4,781,804 describes a method to remove plastic bleed from the leads of semiconductor components by means of an electrolytic treatment in a solution containing an alkali-metal hydroxide, detergent, a glycol compound, alkali metal bicarbonate, ethoxylated furfuryl alcohol, tetrahydrofurfuryl alcohol and a fluorinated surfactant in water and whereby the components are connected as a cathode to a source of direct current so that hydrogen is generated on the metal surface upon current passage. In practice, it appears that this solution contains aggressive components attacking the material of the plastic encapsulation.

Thus, there remains a need for an improved method for removing plastic flash and/or bleed from the metal surfaces of semiconductor devices and the like. There also remains a need for bath compositions to be used in such a method.

SUMMARY OF THE INVENTION

Accordingly, it is one object of the present invention to provide a novel method for removing plastic flash and/or bleed from the metal surfaces of semiconductor devices and the like.

It is another object of the present invention to provide a method for removing plastic flash and/or bleed from the metal surfaces of semiconductor devices and the like which does not damage the plastic encapsulation of the semiconductor device.

It is another object of the present invention to provide a method for removing plastic flash and/or bleed from the metal surfaces of semiconductor devices and the like which does not create a rough surface on the metal surface.

It is another object of the present invention to provide novel bath compositions for carrying out such a method.

These and other objects, which will become apparent during the following detailed description, have been achieved by the inventor's discovery that plastic flash and/or bleed may be effectively removed from the metal surfaces of semiconductor devices and the like by:

(i) immersing such a device in a water-based solution of one or more organic solvents, one or more conducting salts, and a wetting agent;

(ii) connecting the device to be cleaned to the negative pole of a source of direct current of which the positive pole is connected to an anode immersed in the same solution; and (iii) applying sufficient direct current such that the pH value of the liquid film directly adjacent to the metal surface is raised such that hydrogen gas is generated at the metal surface and the plastic flash and/or bleed on the metal surface is softened and removed by the hydrogen.

According to the present invention, an improved method is obtained for removing plastic bleed from the outer leads of encapsulated semiconductor components whereby the encapsulating material is not attacked and whereby no additional surface treatments are necessary before subsequent solder plating. In conventional methods for removing bleed, it was frequently necessary to subject the metal surface to a chemical or electrolytic polishing treatment after plastic bleed removal.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein.

DETAILED DESCRIPTION OF THE PREFERRED EMBODIMENTS

Figure 1:
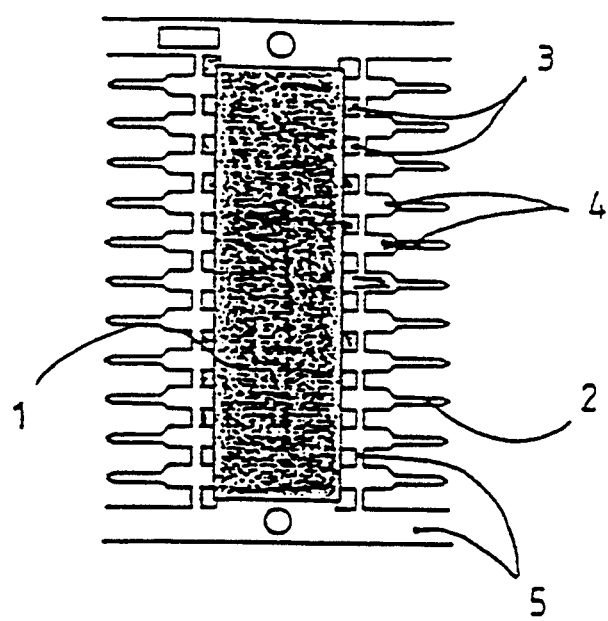
FIG. 1 illustrates a semiconductor device on which bleed (4) is found on the metal surfaces.

Thus, the method according to the present invention is characterized in that, upon passage of a current through the solution, the pH-value of the liquid film directly adjacent to the metallic surface is raised to a value whereby the solvent in the solution causes a softening action on the plastic bleed, sufficiently, to enable the hydrogen gas generated simultaneously at the metal surface to push off the plastic bleed. In the high pH catholyte the solvents present in the electrolyte and supported by the wetting agent, soften the plastic bleed to such an extent that the hydrogen gas generated at the metal surface simultaneously, is able to mechanically scrub the surface clean of the softened plastic bleed. Possible remnants of the softened plastic bleed can be easily removed by a subsequent pressure rinse or by a pressurized air jet.

The bath in which the plastic flash or bleed is removed in the present method is water-based solution which comprises: (a) water; (b) one or more organic solvents; (c) one or more conducting salts; and (d) a wetting agent.

Many wetting agents are suitable to be used in the water-based solution for removing plastic flash or bleed according to the present invention. Examples of such suitable wetting agents are: sodium alkyl phenolether sulphate, sodium alkyl aryl sulphonate, nonyl phenol ethoxylate and ether carboxylates having 4-8 carbon atoms. Such wetting agents have to be resistant to the electrolyte and under the circumstances as used and they should avoid the formation of foam. Particularly, 2-amino-2-methylpropanol has proven to be excellently suitable since it combines good wetting properties with low foaming characteristics. This wetting agent can be used in concentrations of 0.5–2.5% by volume, preferably 1.0 to 2.0% by volume, based on the total volume of the water-based solution.

As organic solvents, $C_{1-4}$-alkyl esters of lactic acid are preferred. Particularly preferred esters are methyl, ethyl, isopropyl or butyl lactate. The alkyl esters with the lower number of carbon atoms are most soluble in water. At a pH value over 7, relative rapid hydrolyses of the lactate esters takes place resulting in the formation of lactic acid. Suitably, the water-based solution contains 10–20% by volume of $C_{1-4}$-alkyl lactate, preferably 12 to 18% by volume of $C_{1-4}$-alkyl lactate, based on the total volume of the water-based solution.

Salts which must be added to obtain sufficient conductivity of the solution can be organic or inorganic but are preferably potassium, sodium or ammonium salts of acetic acid, while suitable inorganic salts are the potassium, sodium and ammonium salts of sulfuric, phosphoric or carbonic acids. Chlorides would also be suitable but are usually not permitted in the manufacturing process of semiconductors. The concentration of conducting salts must be adequate to provide a pH between 10–13 in the catholyte when a DC current is applied with a cathodic current density (C.D.) of 25–40 $A/dm^2$ and whereby the pH of the bulk of the electrolyte is maintained between 6 and 7. Typically, the concentration of electrolyte in the water based solution will be 10 to 100 g/l, preferably 25 to 75 g/l, based on the total volume of the water-based solution.

The softening effect of the alkyl esters of lactic acid on plastic bleed may be further improved by the addition of other water soluble solvents, particularly by the addition of 0.5–2.5 ml/liter, preferably 1.0 to 2.0 ml/liter, of 4-methyl-2-pentanol, based on the total volumen of the water-based solution.

When passing a direct current through an electrolyte, the pH in the cathode film (catholyte) will increase and the pH in the anode film (anolyte) will decrease in comparison with the pH of the bulk solution. The deviation is dependent upon the type of solution and upon the local current density (C.D.; $A/dm^2$). The higher the C.D., the larger the pH difference between the bulk of the solution and catholyte or anolyte will be.

The method of the present invention utilizes this phenomena for removal of plastic bleed from metal surfaces by employing a solution with a bulk pH between 6.0 and 7.0. At this pH, hydrolysis of alkyl lactates is negligible. When direct current is passed through the solution, whereby the components are cathodic, and the C.D. has a value between 30–40 $A/dm^2$ the pH in the catholyte will increase to a value well over 12. These high pH values are created only in the areas where metal is exposed, such as in the pores of the plastic bleed and the immediate area surrounding the pores. There will be no pH increase at the surface of the bulk of plastic encapsulating material. The result of this is zero attack on the encapsulating plastic, while the bleed, which normally is less than 10 micrometers thick and hence very porous will be exposed to a high pH environment which almost instantly softens the bleed. The vigorous evolution of fine hydrogen bubbles formed simultaneously acts as a scrubber and largely removes the plastic bleed. Any remaining, now loosely adhering, remnants of the plastic bleed may be completely removed in a subsequent pressurized water rinse or with an air jet.

The present method for removing plastic bleed from metal surfaces utilizes a solution with a temperature between 35°–50° C. preferably at appr. 45° C. for 0.5 to 2 min., preferably appr. 1 minute. Also at longer exposure times no attack of plastic encapsulating material will take place, in areas other than the plastic bleed film which must be removed. Suitably, a DC current of 8 to 20 volts, preferably 10 to 15 volts and a current density of 25 to 40 $A/dm^2$, preferably 30 to 35 $A/dm^2$, is applied to the water-based solution.

Other features of the invention will become apparent in the course of the following descriptions of exemplary embodiments which are given for illustration of the invention and are not intended to be limiting thereof.

EXAMPLES

Example I

Several solutions were prepared and tested for their ability to soften plastic encapsulations of semiconductor components as indicated in FIG. 1. These components were immersed in the following solutions:
1) Pure ethyl lactate.
2) 98 vol. % ethyl lactate with 2 vol. % 4-methyl-2-pentanol.
3) 90 vol. % ethyl lactate with 10 vol. % water.
4) 90 vol. % ethyl lactate with 10 vol. % of a concentrated KOH solution (appr. 250 g/1 KOH).
5) 88 vol. % ethyl lactate with 2 vol. % 4-methyl-2-pentanol and 10 vol.% concentrated KOH solution.

The pH of solutions 1, 2 and 3 was well below 7, while the pH of solutions 4 and 5 was over 12. The immersion of the components in the solution took place at ambient temperature.

After exposure, the components were rinsed and the black encapsulation plastic was rubbed with soft white tissue paper. The intensity of the black contamination on the tissue paper after 4 rubs was considered as a measure of the degree of attack on the plastic.

In freshly prepared solutions 1, 2 and 3, no attack was visible after 1 minute exposure and also not after 1 hour. Only after 24 hours immersion, a very slight attack on the encapsulation material was observed.

The freshly prepared solutions 4 and 5 showed considerable attack of the plastic encapsulating already after 1 minute exposure. The degree of attack was considered sufficient for solution 4 and very good for solution 5.

When the tests with solutions 4 and 5 were repeated the next day, no attack of the plastic was noticeable after one minute, nor after one hour exposure. Even after 24 hours, attack of the plastic was hardly noticeable. This phenomena can probably be explained by the hydrolysis of the ethyl lactate at the high pH of solutions 4 and 5, making them inactive.

Example II

Leadframes for integrated circuits were manufactured and assembled in the standard industrial way, and finally encapsulated with an epoxy based plastic. These leadframes showed plastic bleed on the outer lead metal surfaces. This plastic bleed film was removed using the method of this invention as will be explained hereafter. The process time for removing the plastic bleed was 1 minute and 15 seconds and followed by a pressurized water rinse for 5 seconds; after which a final treatment took place in the form of electroplating with tin-lead alloy.

After electroplating, the samples were inspected for detection of bare spots in the electroplated coating, which would indicate incomplete removal of the plastic bleed film.

In a parallel test using a known composition for electrocleaning metal surfaces (containing sodium hydroxide, potassium phosphate, sodium gluconate and sodium pyrophosphate) 30–40% of the original plastic bleed area was not removed and showed up as bare spots after tin-lead plating.

According to the invention different compositions 1–4 as indicated in the table below were used.

| Ingredient | Sol. 1 | Sol. 2 | Sol. 3 | Sol. 4 |
|---|---|---|---|---|
| Ethyl lactate | 10% | — | 10% | 20% |
| Isopropyl lactate | — | 15% | — | — |
| Potassium phosphate | 60 gl | — | — | 12 g/l |
| Sodium acetate | — | 75 g/l | — | — |
| Potassium acetate | — | — | 50 g/l | 40 g/l |
| 2-Amino-2-methylpropanol | 1% | 2% | 2% | 1% |
| 4-Methyl-2-pentanol | 0.5 ml/l | 1 ml/l | 2 ml/l | 1 ml/l |

With solutions 1–4 of the table, leadframes were obtained which were completely free of plastic bleed on the metal surfaces of the outer leads. During the treatments, the temperature of the solutions was maintained at 40°–50° C. Also at lower temperatures the method could be used successfully, but it required higher bath voltages.

At the temperatures of 40°–50° C. the current densities applied were between 25–35 A/dm$^2$. At C.D. below 20 A/dm$^2$ the removal of the plastic bleed was not complete.

All experiments were carried out at pH values between 6.0 and 7. When pH was below 6.0 a slight attack of the anode material was noticed, so it is recommended to maintain a pH value not below 6.0, while at pH values over 7.5 danger exists for the hydrolyses of the alkyl lactates. The treatment time was varied between 30 seconds and 2 minutes whereby a treatment of 30 seconds gave already adequate results.

Example III for comparison

The tests described in the table of Example II, were repeated under identical conditions and solution compositions, except that the encapsulated leadframes with plastic bleed on the outer lead metal surfaces were connected to the positive pole of the direct current source and hence were exposed as anodes.

It was estimated that the pH of the anolyte, the electrolyte film directly adjacent to the metal surface was well below 4.

After the treatment, the leadframes were electroplated with tin-lead and inspected for bare spots. All leadframes showed numerous bare spots and were identical to a sample which was tin-lead plated without being submitted to a deflash-treatment.

Surprisingly, it was also found that the plastic bleed residues had hardened which is believed to be caused by the reaction of oxygen, developed at the anode surface, with the epoxy bleed films. It was also noted that the subsequent tin-lead coatings were of an inferior coarser structure than those on the leadframes of Example II, which was to all probability caused by the etching of the metal surfaces during the anodic treatment.

Obviously, numerous modifications and variations of the present invention are possible in light of the above teachings. It is therefore to be understood that, within the scope of the appended claims, the invention may be practiced otherwise than as specifically described herein.

WHAT IS CLAIMED AS NEW AND DESIRED TO BE SECURED BY LETTERS PATENT OF THE UNITED STATES IS:

1. A method for electrolytically removing plastic mold flash or bleed from a metal surface of a semiconductor device comprising:
   (i) immersing said device in a water-based solution, comprising one or more organic solvents, one or more conducting salts, and a wetting agent;

(ii) connecting said device to the negative pole of a source of direct current of which the positive pole is connected to an anode in said solution; and (iii) passing sufficient current through said solution such that hydrogen gas is generated at said metal surface and the pH-value of the liquid film directly adjacent to said metal surface is raised such that said plastic bleed is softened sufficiently to be removed by said hydrogen gas.

2. The method of claim 1, wherein said solution comprises 10–20 vol. % of a $C_{1-4}$-alkyl lactate.

3. The method of claim 1, wherein said solution comprises of 0.5–2 ml/1 of 4-methyl-2-pentanol.

4. The method of claim 1, wherein said solution comprises 10–20 vol. % of a $C_{1-4}$-alkyl lactate and 0.5–2 ml/1 4-methyl-2-pentanol.

5. The method of claim 1, wherein said solution comprises a sodium, potassium, or ammonium salt of an inorganic acid.

6. The method of claim 5, wherein said solution comprises a sodium, potassium, or ammonium salt of phosphoric acid.

7. The method of claim 6, wherein the concentration of said conducting salt is such that when a current density of 25–40 A/dm is applied the pH value of the catholyte is raised to a value higher than 10.

8. The method of claim 1, wherein said solution comprises a sodium, potassium, or ammonium salt of an organic acid.

9. The method of claim 8, wherein said solution comprises sodium, potassium, or ammonium acetate.

10. The method of claim 9, wherein the concentration of said conducting salt is such that when a current density of 25–40 A/dm is applied the pH value of the catholyte is raised to a value higher than 10.

11. The method of claim 1, wherein said solution has a bulk pH value of 6.0–7.0.

12. The method of claim 1, wherein said solution comprises 0.5–2.5 vol. % of a wetting agent.

13. The method of claim 11, wherein said wetting agent is 2-amino-2-methylpropanol.

* * * * *